United States Patent
Fujieda et al.

(10) Patent No.: US 6,545,924 B2
(45) Date of Patent: Apr. 8, 2003

(54) SEMICONDUCTOR MEMORY DEVICE

(75) Inventors: Waichiro Fujieda, Kawasaki (JP); Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/929,357

(22) Filed: Aug. 15, 2001

(65) Prior Publication Data

US 2002/0024865 A1 Feb. 28, 2002

(30) Foreign Application Priority Data

Aug. 31, 2000 (JP) ........................ 2000-264358

(51) Int. Cl.$^7$ ................................ G11C 7/00
(52) U.S. Cl. ..................... 365/222; 365/233.5
(58) Field of Search ............... 365/222, 233.5, 365/189.07

(56) References Cited

U.S. PATENT DOCUMENTS

| | | | | |
|---|---|---|---|---|
| 5,075,886 A | * | 12/1991 | Isobe et al. | 365/222 |
| 6,256,248 B1 | * | 7/2001 | Leung | 365/222 |
| 6,275,437 B1 | * | 8/2001 | Kim et al. | 365/222 |
| 6,327,210 B1 | * | 12/2001 | Kuroda et al. | 365/222 |
| 6,392,958 B1 | * | 5/2002 | Lee | 365/222 |
| 6,396,758 B2 | * | 5/2002 | Ikeda et al. | 365/222 |

* cited by examiner

Primary Examiner—Tan T. Nguyen
(74) Attorney, Agent, or Firm—Arent Fox Kintner Plotkin & Kahn, PLLC

(57) ABSTRACT

A semiconductor memory device having a self-refresh function includes a detection circuit detecting a change of an output enable signal and generating a state transition detection signal, and a decision circuit comparing the state transition detection signal and a refresh request signal internally generated and generating a signal that indicates a corresponding circuit operation.

12 Claims, 9 Drawing Sheets

SEMICONDUCTOR MEMORY DEVICE

CROSS REFERENCE TO RELATED APPLICATION

The present application is based on Japanese Priority Patent Application No. 2000-264358 filed on Aug. 31, 2000, the entire contents of which are hereby incorporated.

BACKGROUND OF THE INVENTION

1. Field of the Invention

The present invention generally relates to semiconductor memory devices, and more particularly to a semiconductor memory device of DRAM type in which a self-refresh operation is constantly performed.

2. Description of the Related Art

Recently, an increased amount of data has been handled in a portable mobile terminal such as a cellular phone due to collaboration with the Internet. Nowadays, an SRAM having small power consumption is widely used in cellular phones. However, the SRAM has a disadvantage in that the SRAM has a comparatively low integration density and the cost increases as the integration density increases. In contrast, the DRAM is less expensive and has a large memory capacity. It is to be noted that the command system of the SRAM differs from that of the DRAM, so that the SRAM cannot be simply replaced by the DRAM. One of the major problems in the replacement resides in refresh control of the DRAM. The DRAM needs refresh control that constantly refreshes the memory cells in order to hold data stored therein. A constant refresh operation is enabled by externally supplying the DRAM with a refresh command. However, this applies a considerable load on a controller.

Hence, it is required that the DRAM itself periodically refreshes the memory cells (self-refresh). In the DRAM of an asynchronous type independent of clock, the refresh request internally generated may collide with an external request for an active operation (for example, a data read command or a data write command). When the refresh request leads to the read/write command from the outside of the DRAM, the read/write operation is executed after the refresh operation is completed. In contrast, when the read/write command leads to the refresh request, the refresh operation is executed after the read/write operation is completed. That is, there is no regularity between the read/write command and the refresh command, so that one of the requests that leads to the other in terms of timing is executed first.

The read/write command may be defined by a combination of control signals externally supplied (which may be called command signals). The control signals may include a chip enable signal /CE, a write enable signal /WE, and an output enable signal /OE. The read/write operation starts in synchronism with the falling edge of the chip enable signal /CE. A state transition detection signal is generated by detecting the falling edge of the chip enable signal /CE. The timing of the state transition detection signal and the timing of the refresh request internally generated are compared, and one of the signals that leads to the other is executed.

However, the conventional technique for detecting the falling edge of the chip enable signal /CE and generating the state transition detection signal causes an output delay of read data.

More specifically, the DRAM operates slower in case where consecutive read operations are applied or the read operation is executed after the write operation. The read operation is initiated in synchronism with the falling edge of the chip enable signal /ED. Hence, it is necessary to raise the chip enable signal /CE and lower it again after the read operation is completed. The read operation is delayed by the time necessary to raise the chip enable signal /CE to the high level. Similarly, the read operation after the write operation is delayed by the time necessary to raise the chip enable signal /CE to the high level.

SUMMARY OF THE INVENTION

It is a general object of the present invention to eliminate the above disadvantages.

A more specific object of the present invention is to provide a semiconductor memory device capable of outputting read data faster.

The above objects of the present invention are achieved by a semiconductor memory device having a self-refresh function comprising: a detection circuit detecting a change of an output enable signal and generating a state transition detection signal; and a decision circuit comparing the state transition detection signal and a refresh request signal internally generated and generating a signal that indicates a corresponding circuit operation.

The above objects of the present invention are achieved by a semiconductor memory device having a self-refresh function comprising: a detection circuit detecting a change of a write enable signal and generating a state transition detection signal; and a decision circuit comparing the state transition detection signal and a refresh request signal internally generated and generating a signal that indicates a corresponding circuit operation.

The above objects of the present invention are also achieved by a semiconductor memory device having a self-refresh function comprising: a detection circuit detecting a change of an output enable signal, a change of a chip enable signal, and a change of a write enable signal and generating a state transition detection signal; and a decision circuit comparing the state transition detection signal and a refresh request signal internally generated and generating a signal that indicates a corresponding circuit operation.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will be given, with reference to FIGS. 1 through 4, of the principle of the present invention, as compared to the prior art.

Figure 1:
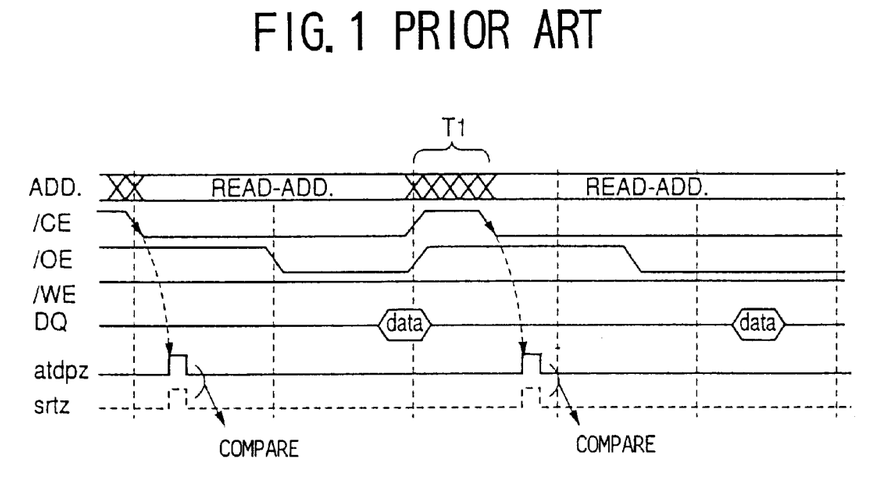
FIG. 1 is a timing chart of a read operation of a conventional semiconductor memory device.
Figure 2:
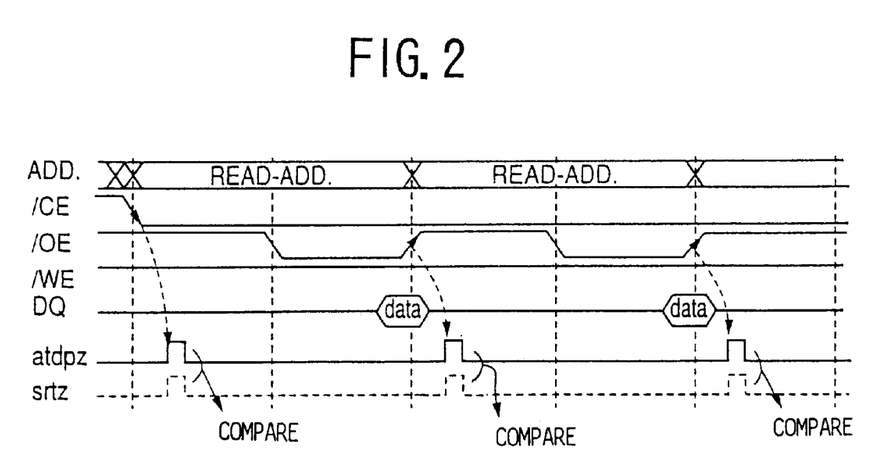
FIG. 2 is a timing chart of a read operation of a semiconductor memory device according to an embodiment of the present invention.
Figure 3:
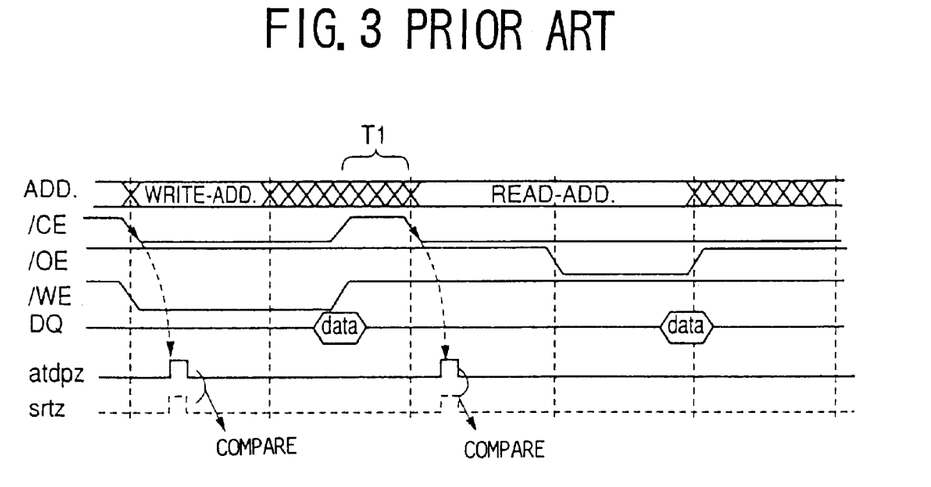
FIG. 3 is a timing chart of a read operation of a conventional semiconductor memory device.
Figure 4:
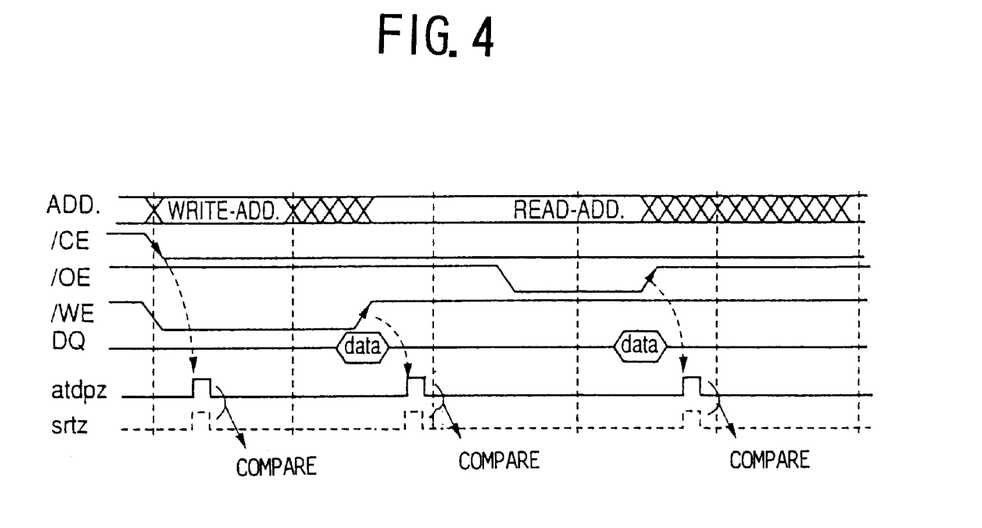
FIG. 4 is a timing chart of a read operation of a semiconductor memory device according to an embodiment of the present invention.

FIGS. 1 and 2 show a case where two read operations are successively performed, wherein FIG. 1 shows a prior art operation and FIG. 2 shows an operation of the present invention. FIGS. 3 and 4 show a case where a read operation is performed after a write operation is performed, wherein FIG. 3 shows a prior art operation and FIG. 4 shows an operation of the present invention. FIGS. 1 through 4 have the same time axes.

First, a description will be given, with reference to FIGS. 1 and 2, of the case where two consecutive read operations are performed. When the chip enable signal /CE falls to the low level and the output enable signal /OE falls, data DQ associated with read address ADD is read on a data bus. A state transition detection signal atdpz is generated by detecting the falling edge of the chip enable signal /CE. The state transition detection signal atdpz is compared with a refresh request signal srtz internally generated. Then, one of the requests that leads to the other one is selected and executed. For the next read operation, the chip enable signal /CE changes to the high level once and falls to the low level. Then, the read operation is performed similarly.

In contrast, the operation of the invention shown in FIG. 2 differs from that of the prior art as follows. First, the state transition detection signal atdpz is generated by detecting the falling edge of the output enable signal /OE in addition to the chip enable signal /CE. Second, when successive read operations are performed, the chip enable signal /CE is maintained at the low level.

In the first read operation shown in FIG. 2, the chip enable signal /CE falls, and the state transition detection signal acdpz is generated in synchronism with the falling edge of the chip enable signal /CE. In the next read operation, the state transition detection signal acdpz is generated in synchronism with the rising edge of the output enable signal /OE. The chip enable signal /CE is maintained at the low level. That is, there is no need to raise the chip enable signal /CE once as in the prior art. Thus, the present invention does not have time T1 (FIG. 1) necessary for raising the chip enable signal /CE once. As a result, the time necessary for outputting read data can be reduced as is clearly seen from the output timings of read data DQ by the second read operations shown in FIGS. 1 and 2.

Next, a description will be given, with reference to FIGS. 3 and 4, of the read operations executed after the write operation.

In the prior art shown in FIG. 3, the chip enable signal /CE falls, and write data DQ is written into a cell corresponding to write address ADD in synchronism with the rising edge of the write enable signal /WE subsequent to the chip enable signal /CE. For the next read operation, the chip enable signal rises once and falls again. Then, the falling edge of the chip enable signal /CE is detected, and the state transition detection signal atdpz is generated. One of the read operation and the refresh operation is performed based on the timing relationship between the state transition detection signal atdpz and the refresh request signal internally generated.

In contrast, the operation of the present invention shown in FIG. 4 differs from that of the prior art shown in FIG. 3. First, the state transition detection signal atdpz is generated by detecting the rising edge of the write enable signal /WE in addition to the chip enable signal /CE. Second, the chip enable signal /CE is maintained at the low level during a period from the write operation to the read operation.

Referring to FIG. 4, the state transition detection signal atdpz is generated by detecting the rising edge of the write enable signal /WE in addition to the chip enable signal /CE. That is, the present invention does not need the operation for raising the chip enable signal /CE needed in the prior art. The next read operation is initiated in response to the rising edge of the write enable signal /WE. Hence, the present invention does not have time T1 (FIG. 3) necessary for raising the chip enable signal /CE once. As a result, the time necessary for outputting read data can be reduced as is clearly seen from the output timings of read data DQ by the second read operations shown in FIGS. 3 and 4.

Figure 5:
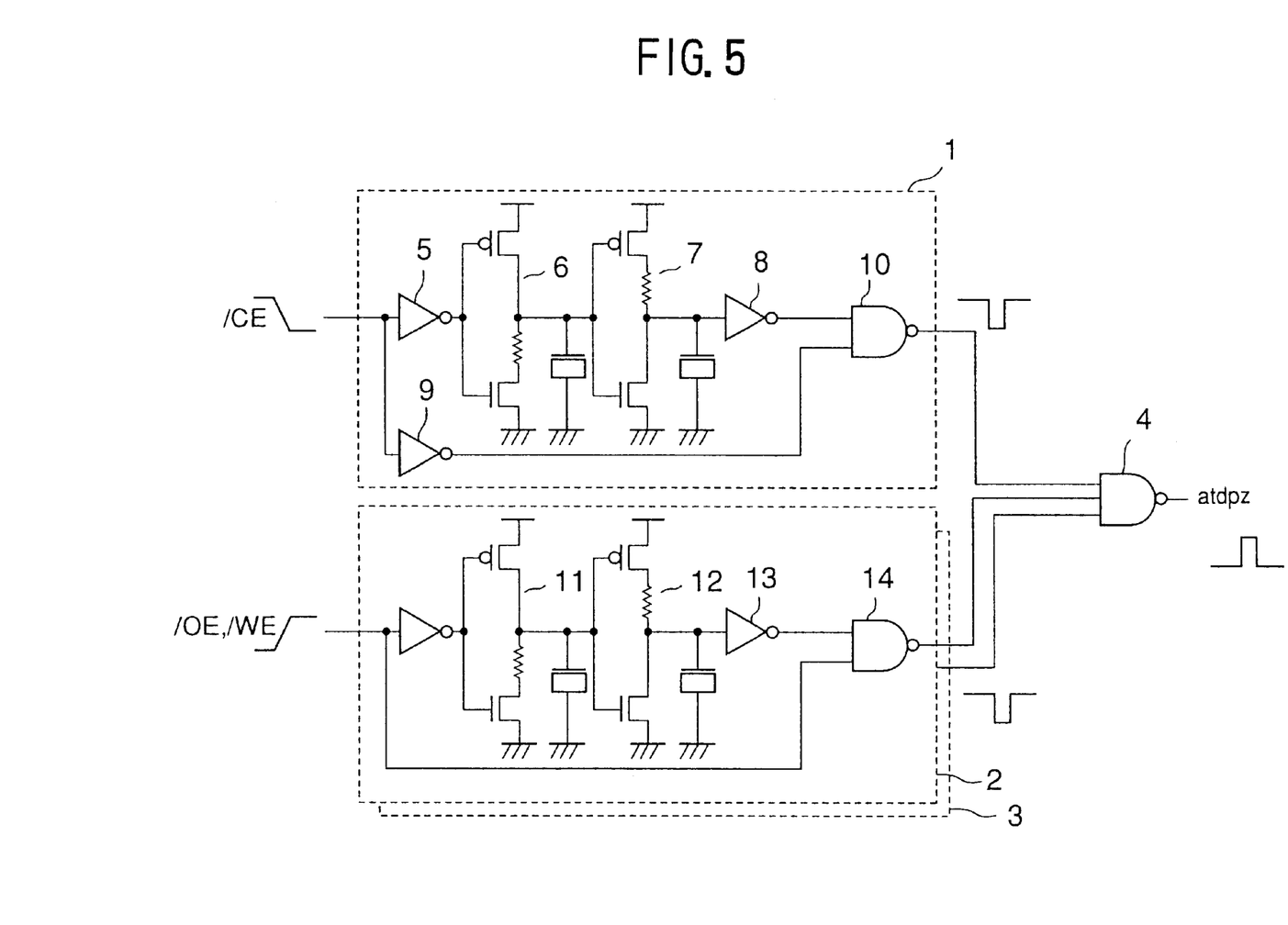
FIG. 5 is a circuit diagram of a configuration of a state transition detection circuit provided in the semiconductor memory device according to the embodiment of the invention.

FIG. 5 is a circuit diagram of a configuration of the state transition detection circuit that generates the state transition detection signal atdpz according to an embodiment of the present invention. The state transition detection circuit is mounted on a DRAM having an interface of SRAM type, and includes three detection circuits 1, 2 and 3, and a NAND gate 4. The detection circuit 1 detects the falling edge of the chip enable signal /CE. The detection circuit 2 detects the rising edge of the output enable signal /OE. The detection circuit 3 detects the rising edge of the write enable signal /WE. The NAND gate 4 receives detection signals from the detection circuits 1, 2 and 3. Each of the detection circuits 1 through 3 detects the falling or rising edge of the target signal.

The detection circuit 1 includes inverters 5, 8 and 9, delay circuits 6 and 7 made up of CMOS inverters, capacitors and resistors, and a NAND gate 10. The chip enable signal /CE passes through the inverter 9, and is applied to the NAND gate 10. Also, the chip enable signal /CE passes through the inverter 5, the delay circuits 6 and 7 and the inverter 8, and is applied to the NAND gate 10 with a delay of time. Thus, the detection circuit 1 detects the falling edge of the chip enable signal /CE, and outputs a single (one shot) pulse that changes to the low level.

The detection circuit 2 includes two delay circuits 11 and 12, an inverter 13 and a NAND gate 14. The output enable signal /OE is applied directly to the NAND gate 14. Also, the output enable signal /OE passes through the delay circuits 11 and 12 and the inverter 13, and is applied to the NAND gate 14 with a delay of time. Thus, the detection circuit 2 detects the rising edge of the output enable signal /OE, and outputs a single pulse that changes to the low level.

The detection circuit 3, which has the same configuration as the detection circuit 2, detects the rising edge of the write enable signal /WE and generates a single pulse that changes to the low level.

The NAND gate 4 receives the detection signals mentioned above. When receiving one of the detection signals, the NAND gate 4 generates a single pulse, which serves as the state transition detection signal atdpz.

Figure 6:
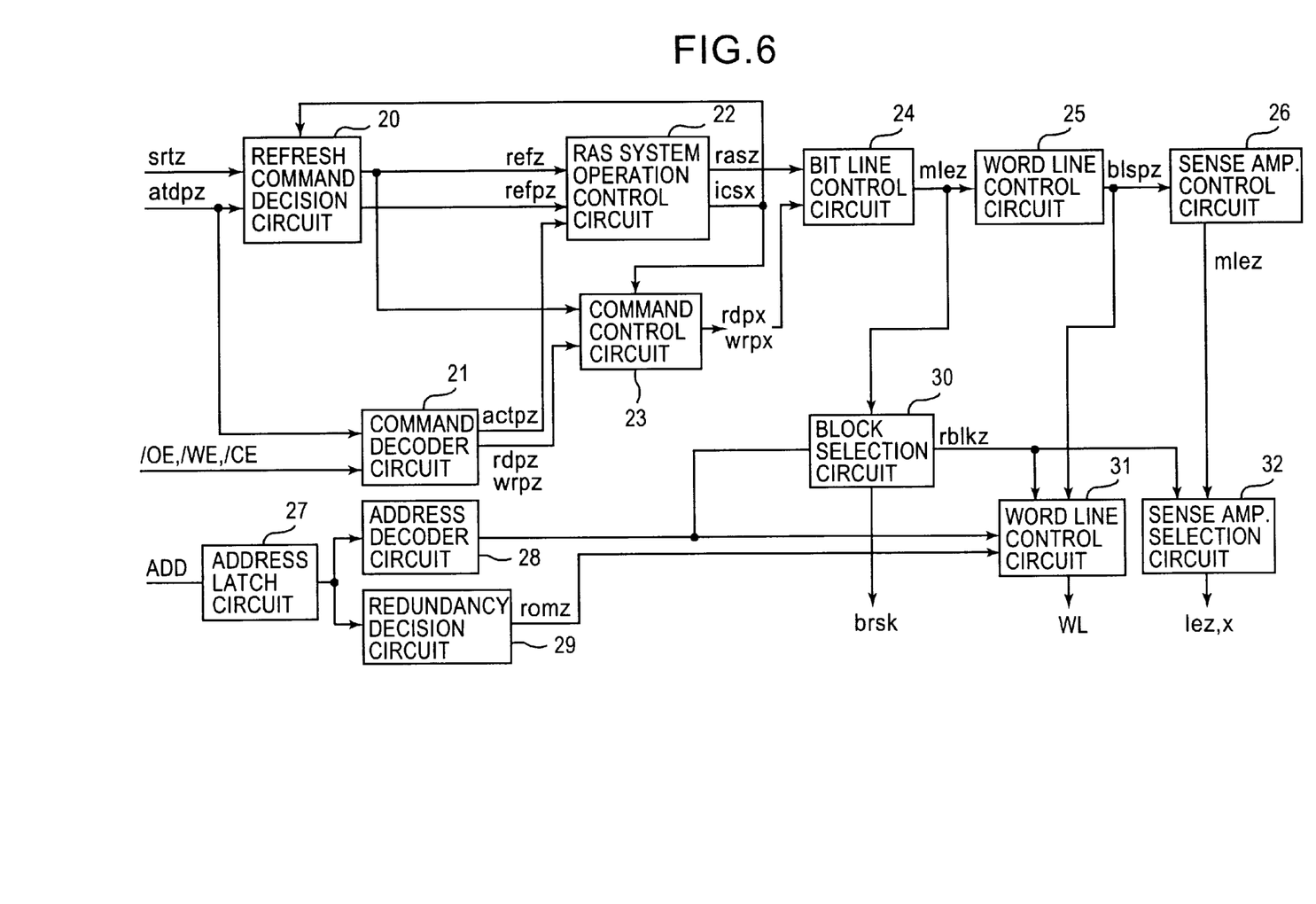
FIG. 6 is a block diagram of a control system of the semiconductor memory device according to the embodiment of the present invention.

The state transition detection signal atdpz output by the state transition detection circuit shown in FIG. 5 is output to a control system of the DRAM shown in FIG. 6.

The control system of the DRAM includes a refresh/command decision circuit 20, a command decoder circuit 21, a RAS system operation control circuit 22, a command control circuit 23, a bit line control circuit 24, a word line control circuit 25, a sense amplifier control circuit 26, an address latch circuit 27, an address decoder circuit 28, a redundancy decision circuit 29, a block selection circuit 30, a word line control circuit 31, and a sense amplifier selection circuit 32.

Figure 7:
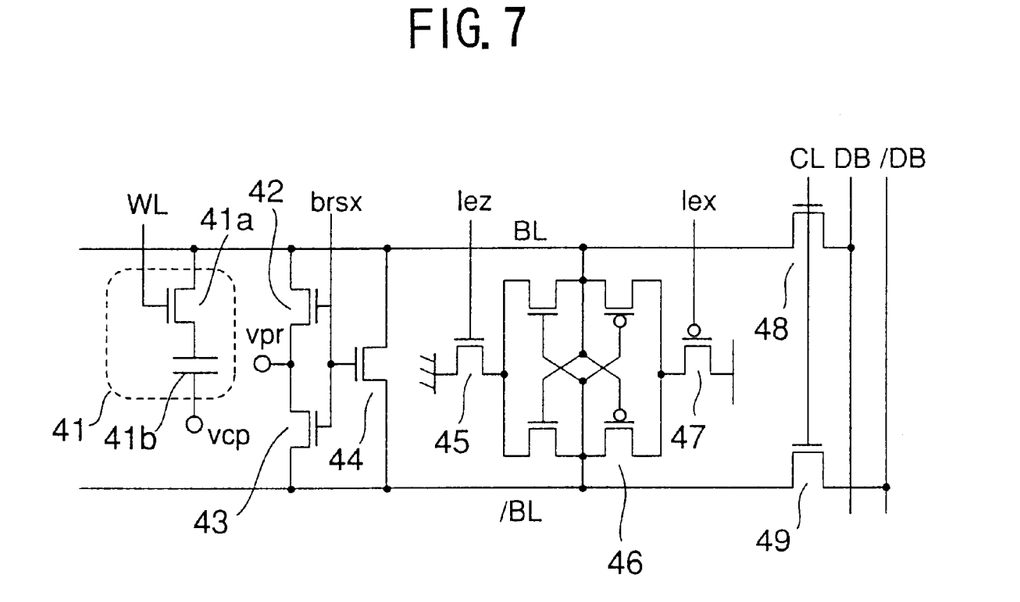
FIG. 7 is a circuit diagram of a configuration of a core circuit.

FIG. 7 shows a configuration of a core circuit controlled by the control system. The core includes a large number of memory cells arranged in a matrix formation. The two-dimensional array is divided into a plurality of blocks. The core shown in FIG. 7 includes a memory cell 41, bit line precharge transistors 42 and 43, a bit line short-circuiting transistor 44, a sense amplifier 46, transistors 45 and 47 for controlling the sense amplifier, and transistors 48 and 49 serving as transfer gates. The memory cell 41 is composed of a cell transistor 41a and a cell capacitor 41b, and is connected to a pair of bit lines BL and /BL (BL in the example shown in FIG. 7). The pair of bit lines BL and /BL are connected to internal data buses DB and /DB via the transfer gates 48 and 49. A symbol vpr is a bit line precharge voltage.

A description will be given, with reference to FIGS. 8 through 10, of an operation of the DRAM shown in FIGS. 6 and 7.

Figure 8:
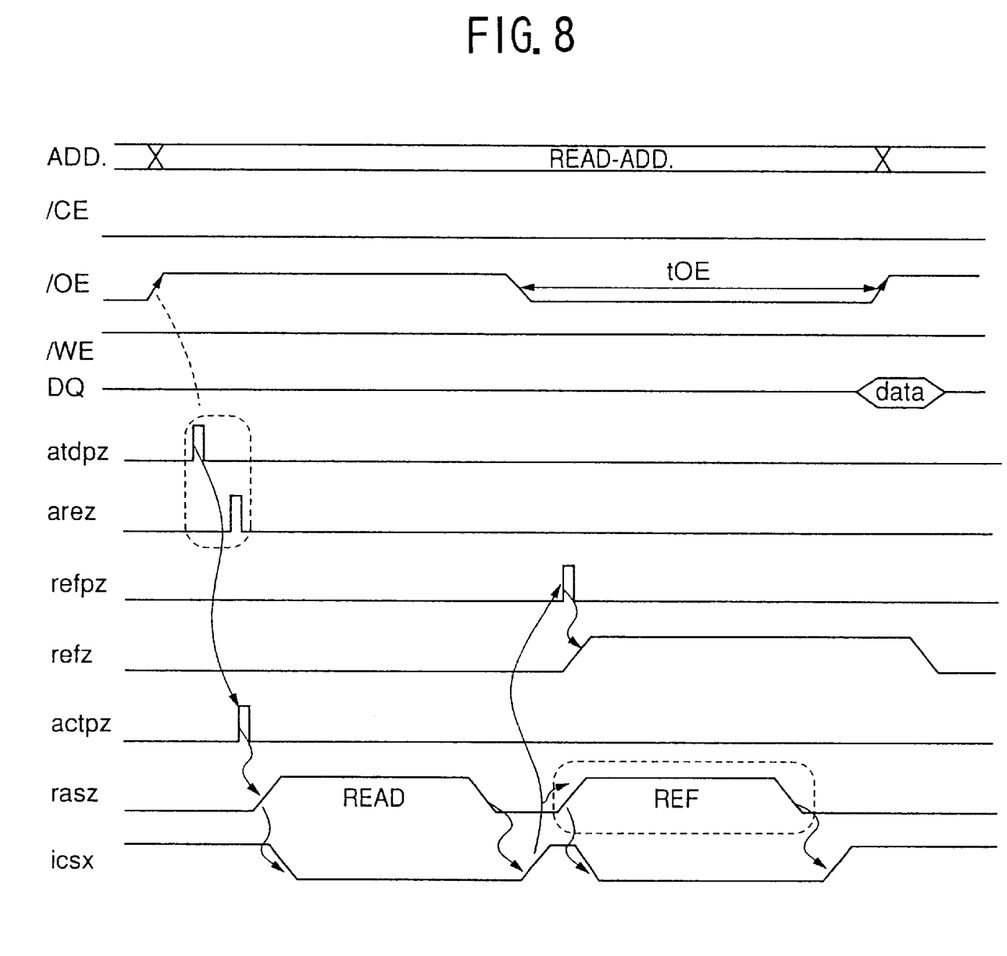
FIG. 8 is a timing chart (part 1) of an operation of the semiconductor memory device according to the embodiment of the present invention.
Figure 9:
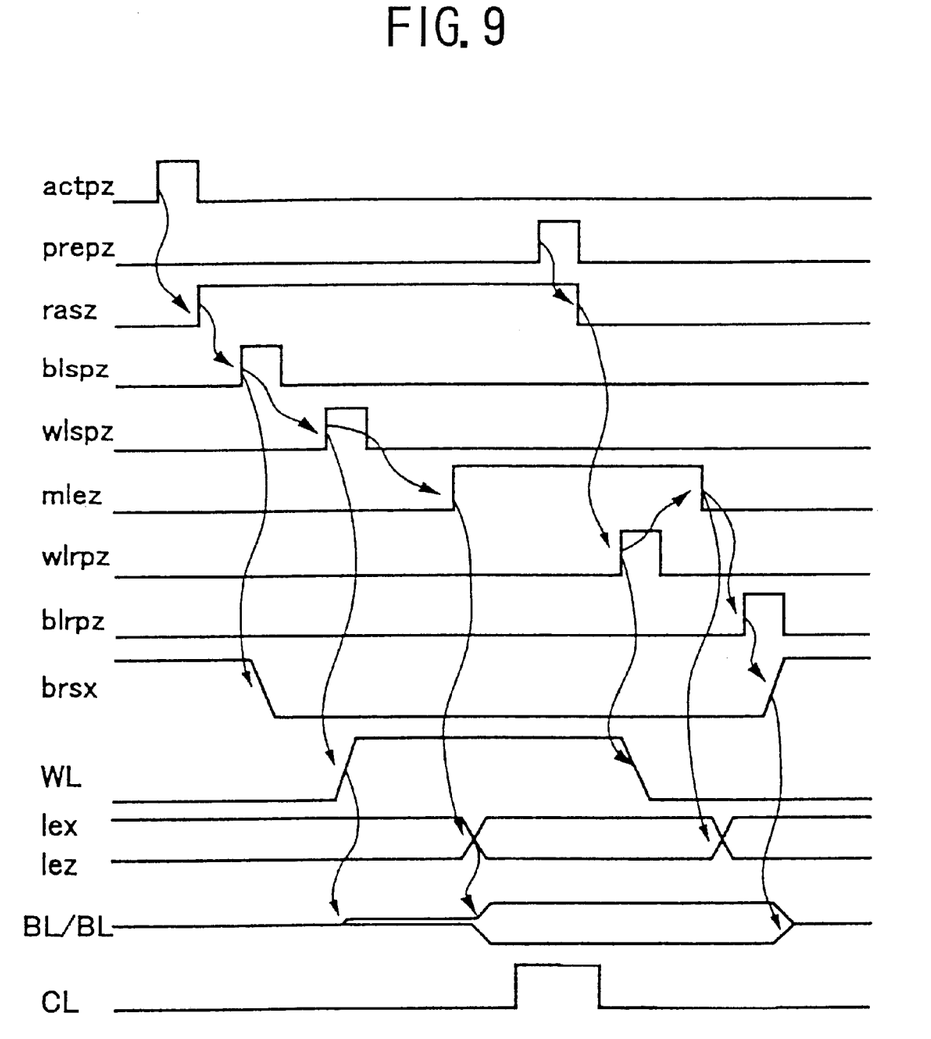
FIG. 9 is a timing chart (part 2) of an operation of the semiconductor memory device according to the embodiment of the present invention.

FIG. 8 shows a read operation that starts from the rising edge of the output enable signal /OE while the chip enable signal /CE has fallen. The state transition detection circuit shown in FIG. 5 detects the rising edge of the output enable signal /OE, and outputs the state transition detection signal atdpz to the refresh/command decision circuit 20 shown in FIG. 6. The refresh/command decision circuit 20 receives the refresh request signal srtz from a refresh control circuit 60, which will be described with reference to FIG. 11, and compares the timing thereof with that of the state transition detection signal atdpz. FIG. 8 shows a case where the state transition detection signal atdpz leads to the refresh request signal. In this case, the refresh/command decision circuit 20 sets the refresh signal refz at the low level, which shows that the circuit is not in the refresh state.

The command decoder circuit 21 receives the state transition detection signal atdpz, and decodes a command defined by the combination of the external control signals /CE, /WE and /OE. The command decoder circuit 21 outputs the active command actpz to the RAS system operation control circuit 22, and outputs the read command rdpz to the command control circuit 23. The RAS system operation control circuit 22 receives the active command actpz, and generates a core activation signal rasz. Further the circuit 22 sets a standby signal icsx at the low level. The standby signal icsx has the reverse phase to the core activation signal rasz and lags behind the signal rasz. The refresh/command decision circuit 20 receives the standby signal icsx at the low level, and is ready for the refresh operation after the read operation.

The core activation signal rasz is maintained at the high level during the period of the read operation. The RAS system operation control circuit 22 lowers the core activation signal rasz to the low level, and raises the standby signal icsx to the high level. In response to the change of the standby signal icsx to the high level, the refresh/command decision circuit 20 generates the refresh command refpz, and raises the refresh signal refz to the high level. In response to the rising edge of the standby signal icsx, the RAS system operation control circuit 22 raises the active command actpz and lowers the standby signal icsx. Hence, the refresh operation is executed.

Once the external address ADD is latched in the address latch circuit 27, and is input to the address decoder 28 and the redundancy decision circuit 29. The address decoder 28 decodes the address ADD, and controls the word line control circuit 31. The redundancy decision circuit 29 determines whether the external address ADD indicates a faulty bit. If the answer is affirmative, the redundancy decision circuit 29 outputs a signal romz for selecting a redundant word line to the word line control circuit 31.

The command control circuit 23 receives the read command rdpz from the command decoder circuit 21, and generates an internal read command signal rdpz, which is then applied to the bit line control circuit 24. The circuit 24 receives the core activation signal rasz and the internal command signal rdpx, and outputs a timing signal blspz (FIG. 9) for disabling the bit line short-circuiting to the word line control circuit 25 and the block selection circuit 30. The block selection circuit 30 makes a logic operation on the timing signal blspz and associated address bits from the address decoder circuit 28. Then, the circuit sets the bit line short-circuit control signal brsx for the selected block at L. This turns OFF the transistors 42–44 shown in FIG. 7, so that the bit line short-circuiting is disabled. The word line control circuit 25 generates a word line drive timing signal wlspz from the timing signal blspz, and outputs it to the sense amplifier control circuit 26 and the word line control circuit 31.

The block selection circuit 30 outputs a signal rblkz indicative of the selected block to the word line control circuit 31 and th sense amplifier selection circuit 32. The word line control circuit 31 makes a logic operation on the block selection signal rblkz, the word line selection address and the redundant word line selection signal romz. Then, the circuit 31 raises the word line WL upon receiving the timing signal wlspz (changes to the high level). The word line WL rises and data stored in the cell 41 is read out to the bit lines BL and /BL.

The sense amplifier control circuit 26 outputs a timing signal mlez for activating the sense amplifier when a given time elapses from the word line drive timing signal wlspz. Upon receiving the sense amplifier activation timing signal mlez, the sense amplifier selection circuit 32 outputs sense amplifier driving signals lex and lez to the transistors 47 and 45, respectively, which are thus turned ON. Then, the sense amplifier 46 is activated, and amplifies the potential difference between the bit lines BL and /BL. Then, the transistors 48 and 49 receive a column selection signal CL (not shown in FIG. 6) for the column system, and are thus turned ON. The data read to the bit lines BL and /BL are output to the internal data buses DB and /DB.

The data on the bit lines BL and /BL is amplified and is written into the cell again (restored). Then, the bit line precharge is initiated. The RAS system operation control circuit 22 that receives a precharge command prepz (not shown in FIG. 6) from the command decoder 21 lowers the core activation signal rasz. The word line control circuit 25 generates a timing signal wlrpz for resetting the word line from the falling edge of the core activation signal rasz, and outputs it to the word line control circuit 31. Upon receiving that signal, the word line control circuit 31 lowers the selected word line WL. The timing signal wlrpz is generated by a pulse generating circuit (not shown in FIG. 6) which generates a pulse in response to the falling edge of the core activation signal rasz.

The sense amplifier control circuit 26 lowers the sense amplifier activation timing signal mlez when a predetermined time elapses in response to the timing signal wlrpz. In response to the falling edge of the timing signal mlez, the bit line control circuit 24 generates a timing signal blrpz for bit line short-circuiting, and outputs it to the block selection circuit 30. Then, the block selection circuit 30 switches a bit line short-circuit control signal brsx to the high level, so that the bit lines BL and /BL are short-circuited. The timing signal blrpz is generated by a pulse generation (not shown in FIG. 6) in response to the falling edge of the timing signal mlez.

Figure 10:
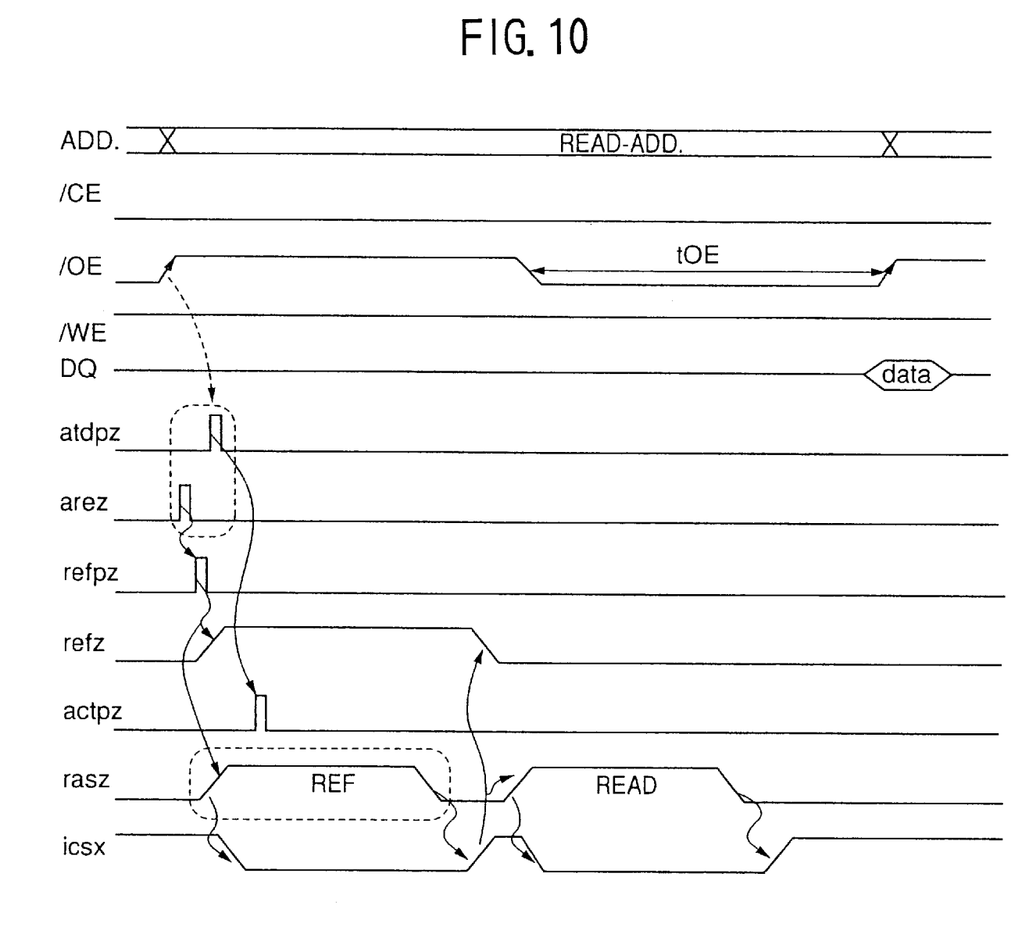
FIG. 10 is a timing chart (part 3) of an operation of the semiconductor memory device according to the embodiment of the present invention.

FIG. 10 shows a case where the refresh request signal srtz leads to the state transition detection signal atdpz. The refresh command decision circuit 20 shown in FIG. 6 receives the refresh request signal srtz, and generates the refresh command refpz and the refresh signal refz, which are then output to the RAS system operation control circuit 22. The circuit 22 raises the core activation signal in response to the refresh command refpz, and lowers the standby signal icsx. Then, has has been described with reference to FIG. 9, the refresh operation is performed. After the refresh operation is completed, the core activation signal rasz falls, and the standby signal icsx rises. In response to the rising edge of the standby signal icsx, the refresh command decision circuit 20 lowers the refresh signal refz, so that the circuit is released from the refresh state. Then, the read operation is stared from the activation signal actpz generated in response to the state transition detection signal atdpz, as in the case shown in FIG. 9.

The write operation is the same as the read operation except that the command decoder circuit 21 shown in FIG. 6 outputs the write command wrpz to the command control circuit 23, which outputs the internal write command signal wrpz.

Figure 11:
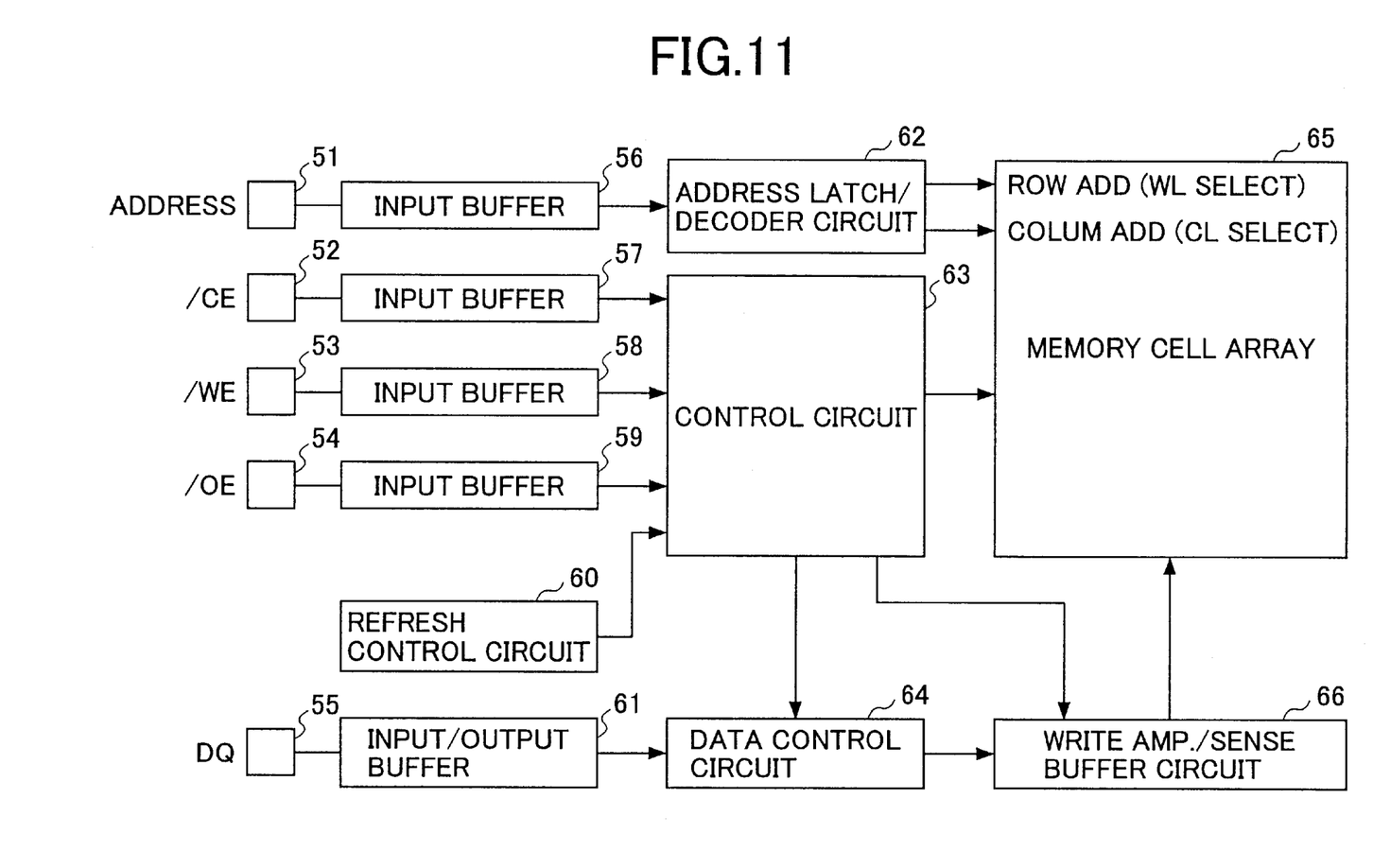
FIG. 11 is a block diagram of an entire structure of the semiconductor memory device according to the embodiment of the present invention.

FIG. 11 is a block diagram of an entire structure of the semiconductor memory device according to one aspect of the present invention. The semiconductor memory device includes an address terminal 51, command input terminals 52–54, an data input/output terminal 55, input buffers 56–59 respectively connected to the terminals 51–54, a refresh control circuit 60 that controls refresh operation, an input/output buffer 61, an address latch/decoder circuit 62, a control circuit 63, a data control circuit 64, a memory cell array (core) 65, and a write amplifier/sense buffer circuit 66.

The address latch/decoder circuit 62 includes the address latch circuit 27, the address decoder circuit 28 and the redundancy decision circuit 29 shown in FIG. 5. The control circuit 63 includes the parts shown in FIG. 5 except the address latch/decoder circuit 27, the address decoder circuit 28 and the redundancy decision circuit 29. The memory cell array 65 has the structure shown in FIG. 7. The write amplifier/sense buffer circuit 66 includes the write amplifiers and sense buffers connected to the internal data buses DB and /DB.

The external address is received via the address terminal 51 and the input buffer 56. Decoded addresses of the row and column systems are output to the memory cell array 65. The external control signals /CE, /WE and /OE are applied to the control circuit 63 via the input buffers 57, 58 and 59. The refresh control circuit 60 generates the refresh request signal srtz, which is output to the refresh/command decision circuit 20. The data control circuit 64 controls data input/output under the control of the control circuit 63.

The present invention is not limited to the specifically disclosed embodiments, and variations and modifications may be made without departing from the scope of the present invention.

What is claimed is:

1. A semiconductor memory device having a self-refresh function comprising:

a detection circuit detecting a change of an output enable signal and generating a state transition detection signal; and a decision circuit comparing the state transition detection signal and a refresh request signal internally generated and generating a signal that indicates a corresponding circuit operation.

2. The semiconductor memory device as claimed in claim 1, wherein the semiconductor memory device starts a read operation in response to the state transition detection signal.

3. The semiconductor memory device as claimed in claim 2, wherein the detection circuit receives a chip enable signal maintained at a predetermined level when successive read operations are performed or when a read operation is performed after a write operation.

4. The semiconductor memory device as claimed in claim 1, wherein the semiconductor memory device has an interface of a static type semiconductor memory device.

5. A semiconductor memory device having a self-refresh function comprising:

a detection circuit detecting a change of a write enable signal and generating a state transition detection signal; and a decision circuit comparing the state transition detection signal and a refresh request signal internally generated and generating a signal that indicates a corresponding circuit operation.

6. The semiconductor memory device as claimed in claim 5, wherein the semiconductor memory device starts a read operation in response to the state transition detection signal.

7. The semiconductor memory device as claimed in claim 6, wherein the detection circuit receives a chip enable signal maintained at a predetermined level when successive read operations are performed or when a read operation is performed after a write operation.

8. The semiconductor memory device as claimed in claim 6, wherein the semiconductor memory device has an interface of a static type semiconductor memory device.

9. A semiconductor memory device having a self-refresh function comprising:

a detection circuit detecting a change of an output enable signal, a change of a chip enable signal, and a change of a write enable signal and generating a state transition detection signal; and a decision circuit comparing the state transition detection signal and a refresh request signal internally generated and generating a signal that indicates a corresponding circuit operation.

10. The semiconductor memory device as claimed in claim 9, wherein the semiconductor memory device starts a read operation in response to the state transition detection signal.

11. The semiconductor memory device as claimed in claim 10, wherein the detection circuit receives a chip enable signal maintained at a predetermined level when successive read operations are performed or when a read operation is performed after a write operation.

12. The semiconductor memory device as claimed in claim 9, wherein the semiconductor memory device has an interface of a static type semiconductor memory device.

* * * * *